United States Patent [19]

Moshayedi

[11] Patent Number: 5,514,907
[45] Date of Patent: May 7, 1996

[54] APPARATUS FOR STACKING SEMICONDUCTOR CHIPS

[75] Inventor: Mark Moshayedi, Orange, Calif.

[73] Assignee: Simple Technology Incorporated, Santa Ana, Calif.

[21] Appl. No.: 408,552

[22] Filed: Mar. 21, 1995

[51] Int. Cl.$^6$ ............................ H01L 23/34; H01L 23/02; H01L 23/04; H05K 7/00
[52] U.S. Cl. .......................... 257/723; 257/685; 257/686; 257/698; 257/724; 361/735; 361/760
[58] Field of Search .................................... 257/723, 724, 257/685, 686, 698; 361/735, 760, 790, 744; 174/52.1, 52.4; 439/83, 65

[56] References Cited

U.S. PATENT DOCUMENTS

| | | |
|---|---|---|
| 3,246,386 | 4/1966 | Ende . |
| 3,290,559 | 12/1966 | Kirby et al. . |
| 3,313,986 | 4/1967 | Kilby . |
| 3,377,516 | 4/1968 | Ellett et al. . |
| 3,403,300 | 9/1968 | Horowitz et al. . |
| 3,515,949 | 6/1970 | Michaels et al. . |
| 3,535,595 | 10/1970 | Moore . |
| 3,614,541 | 10/1971 | Farrand ................................. 361/730 |
| 3,671,812 | 6/1972 | Peluso et al. ........................... 317/118 |
| 3,949,274 | 4/1976 | Anacker ................................. 361/735 |
| 4,017,963 | 4/1977 | Beyerlein ............................... 257/686 |
| 4,288,841 | 9/1981 | Gogal ................................... 257/725 |
| 4,394,712 | 7/1983 | Anthony ................................. 361/411 |
| 4,398,235 | 8/1983 | Lutz et al. ............................. 257/686 |
| 4,631,573 | 12/1986 | Sutrina ................................. 257/714 |
| 4,638,406 | 1/1987 | Samson ................................. 361/403 |
| 4,642,735 | 2/1987 | Hodsdon et al. ........................ 361/424 |
| 4,698,663 | 10/1987 | Sugimoto et al. ....................... 257/713 |

(List continued on next page.)

FOREIGN PATENT DOCUMENTS

| | | |
|---|---|---|
| 2645681 | 10/1990 | France . |
| 58-219757 | 6/1982 | Japan . |
| 60-1606641 | 8/1985 | Japan . |
| 60-254762 | 12/1985 | Japan . |
| 61-63048 | 1/1986 | Japan . |
| 61-75558 | 4/1986 | Japan . |
| 2-260448 | 10/1990 | Japan . |
| 3-96266 | 4/1991 | Japan . |
| 4-209562 | 7/1992 | Japan . |

OTHER PUBLICATIONS

Dense–Pac Microsystems; 16 Megabit high Speed CMOS SRAM.
IBM Technical Disclosure Bulletin, vol. 23 No. 12 May 1981.
3–D Integrated packaging and Interconnect Technology; Wescon/90 Conference Record, held 13–15 Nov. 1990, Anaheim, Ca.
1992 Proceedings. 42nd Electronic Components & Technology Conference. May 18–20, 1992.
Dense–Pac Microsystems flyer/"While others are still defining it . . . Our customers are cashing in!".
Article/Laminated Memory: A New 3 Dimensional Packaging Technology for MCMs. nCHIP, Inc., 1971 N. Capitol Avenue, San Jose, CA 95132 USA.
IBM Technical Disclosure Bulletin. vol. 20 No. 11A Apr. 1978.
IBM Technical Disclosure Bulletin. Vo. 32. No. 3B Aug. 1989.

Primary Examiner—Sara W. Crane
Assistant Examiner—Jhihan Clark
Attorney, Agent, or Firm—Knobbe, Martens, Olson & Bear

[57] ABSTRACT

A multi-chip memory module comprises multiple standard, surface-mount-type memory chips stacked on top of each other, and a pair of printed circuit boards mounted on opposite sides of the memory chips to electrically interconnect the memory chips. Each printed circuit board has vias that are positioned to form multiple rows, with each row of vias used to connect the printed circuit board to a respective memory chip. The vias falling along the bottom-most row of each printed circuit board are also exposed and are used to surface mount the multi-chip module to pads of a memory board.

15 Claims, 8 Drawing Sheets

U.S. PATENT DOCUMENTS

| | | | |
|---|---|---|---|
| 4,706,166 | 11/1987 | Go | 257/676 |
| 4,821,007 | 4/1989 | Fields et al. | 29/830 |
| 4,924,352 | 5/1990 | Septfons | 257/713 |
| 4,953,005 | 8/1990 | Carlson et al. | 257/686 |
| 4,996,583 | 2/1991 | Hatada | 257/724 |
| 4,996,587 | 2/1991 | Hinrichsmeyer et al. | 257/686 |
| 5,016,138 | 5/1991 | Woodman | 257/686 |
| 5,025,307 | 6/1991 | Ueda et al. | 257/696 |
| 5,043,794 | 8/1991 | Tai et al. | 257/686 |
| 5,058,265 | 10/1991 | Goldfarb | 29/852 |
| 5,128,831 | 7/1992 | Fox, III et al. | 257/697 |
| 5,140,745 | 8/1992 | McKenzie, Jr. | 361/406 |
| 5,198,888 | 3/1993 | Sugano et al. | 257/686 |
| 5,241,454 | 8/1993 | Ameen et al. | 257/686 |
| 5,281,852 | 1/1994 | Normington | 257/685 |
| 5,343,075 | 8/1994 | Nishino | 257/685 |
| 5,343,366 | 8/1994 | Cipolla et al. | |

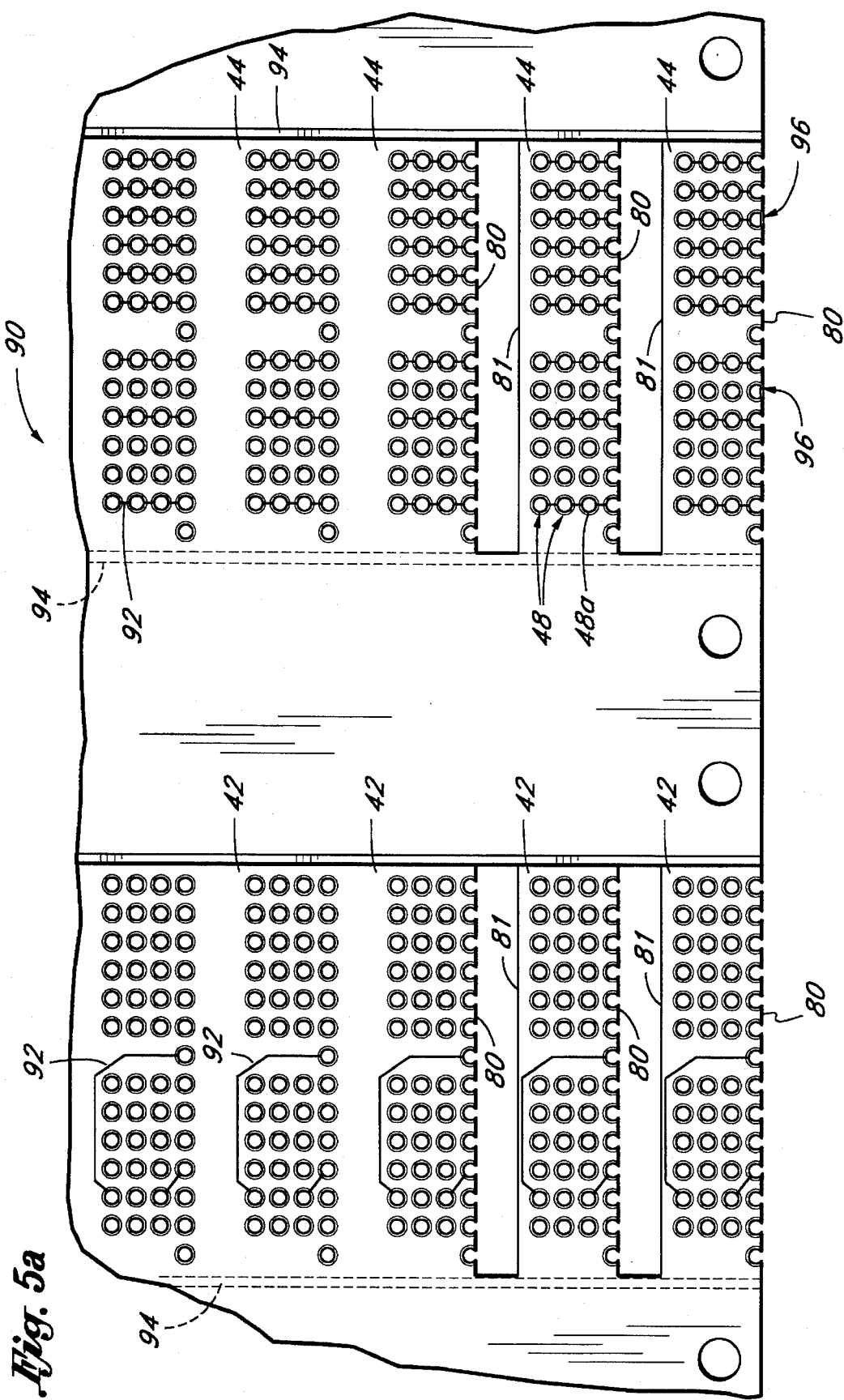

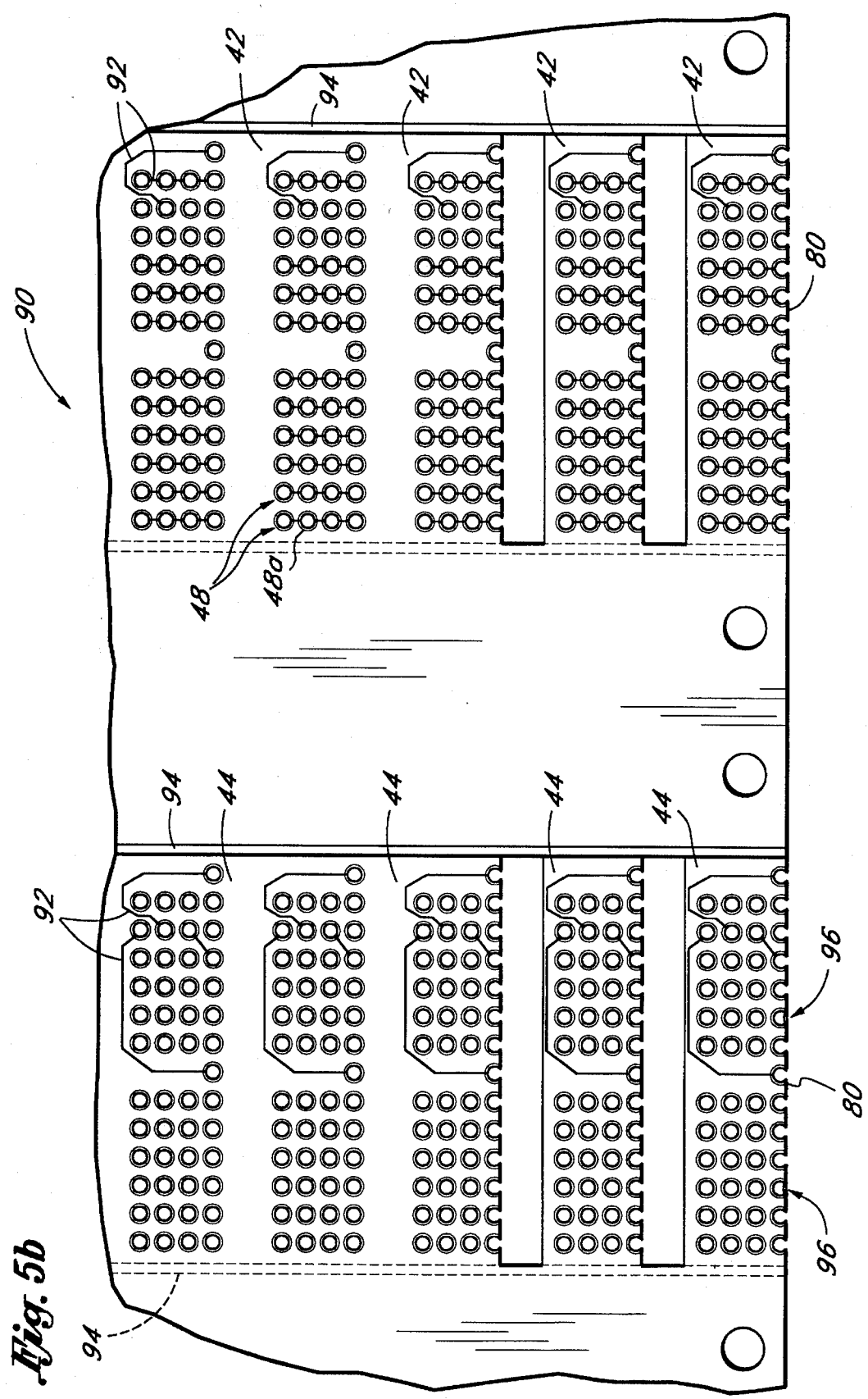

5,514,907

APPARATUS FOR STACKING SEMICONDUCTOR CHIPS

BACKGROUND OF THE INVENTION

1. Field of the Invention

The present invention relates to the vertical stacking of conventional integrated circuit packages to increase the density of components on a printed circuit board. More particularly, the present invention relates to the vertical stacking of conventional memory integrated circuits packages on a surface mount printed circuit board.

2. Description of the Related Art

An integrated circuit or "IC" is a microcircuit formed from active and passive electrical components interconnected on or within a single semiconductor substrate. To protect the IC and to facilitate connection of the IC to a printed circuit board, off-the-shelf ICs are commonly packaged within a ceramic, plastic or epoxy IC package having multiple external terminals or "pins." The full integrated circuit package, including the IC, is commonly referred to as (and will be referred to herein) as a "chip."

As a result of the continuously increasing demand for large random access computer memories, and the demand for smaller computers, various techniques have been developed to increase densities of memory chips on printed circuit boards. In addition to the inherent size advantages provided, increased chip densities enable shorter circuit paths between components, allowing the components to operate at higher speeds while reducing radio-frequency interference (RFI) and electromagnetic interference (EMI) emitted from the printed circuit board.

One development that has led to a significant increase in memory chip densities has been the advent of surface mount technology. With surface mount technology, conventional plated through holes on printed circuit boards are replaced with conductive pads, and through-hole pins of conventional chips are replaced with smaller surface mount pins. Because the pitch or spacing between centers of adjacent surface mount pins is significantly less than the conventional 0.10-inch spacing for conventional through-hole components, surface mount chips tend to be considerably smaller than corresponding conventional chips, and thus take up less space on the printed circuit board. Surface mount technology additionally facilitates the mounting of components on both sides of the printed circuit board.

Various techniques have been developed for increasing chip densities on printed circuit boards by vertically stacking or "piggybacking" two or more chips. See, for example, U.S. Pat. No. 4,996,583 to Hatada, U.S. Pat. No. 4,398,235 to Lutz et al., U.S. Pat. No. 4,953,005 to Carlson et al., Japanese Patent Publication No. 61-63048 to Toshiba Corp., Japanese Patent Publication No. 58-219757 to Tokyo Shibaura Denki K. K., Japanese Patent Publication No. 61-75558 to NEC Corp., and Japanese Patent Publication No. 60-254762 to Fujitsu. These techniques, however, tend to suffer from a number of defects. For instance, many of the techniques require the manufacture of custom chips that are specifically designed for stacking, or else require special modifications to the pins of standard memory chips. Further, many of the techniques do not make use of the various advantages of surface mount technology, such as the ability to maintain a low-profile when memory chips are mounted to the printed circuit board. Further, many proposed techniques for stacking memory chips are not cost effective.

SUMMARY OF THE INVENTION

The present invention involves a multi-chip memory module having two or more vertically stacked memory chips that are interconnected using a pair of printed circuit boards or "side boards." The multi-chip memory module can be constructed using standard, off-the-shelf memory chips, without modification to the pins of the memory chips. The multi-chip memory module is constructed such that pins of the lower-most memory chip in the stack are surface-mountable directly to pads of a memory board, permitting the multi-chip memory module to be mounted with a low profile relative to the memory board.

In accordance with one aspect of the invention, the multi-chip memory module comprises a plurality of memory chips that are stacked on top of one another, with each memory chip having conductive surface mount pins. First and second side boards are mounted to the stacked memory chips such that the side boards are substantially parallel to one another. Each of the two side boards has vias for receiving the surface mount pins of the memory chips, with the vias arranged in rows such that each row corresponds to a respective memory chip. Vias of a bottom-most row of each side board fall along a lower side board edge, so that vias of the bottom-most row serve as surface mount terminals for surface mounting the multi-chip memory module to pads of a printed circuit board. Conductive traces are provided on or within each side board for interconnecting the surface mount pins of the memory chips.

In accordance with another aspect of the invention, there is provided a memory module that includes at least one multi-chip module. The memory module includes a circuit board having at least first and second sets of surface mount pads. The memory module further includes a first side board that is surface-mounted to the first set of surface mount pads such that the first side board is substantially perpendicular to the circuit board, and a second side board that is surface-mounted to the second set of surface mount pads such that the second side board is substantially perpendicular to the circuit board and substantially parallel to the first side board. The memory module further includes a plurality of chips stacked on top of one another between the side boards, with each chip conductively connected to the first and second side boards.

In accordance with an additional aspect of the invention, there is provided a method of increasing the density of memory chips on a memory board. The method includes the step of providing first and second side boards, with each side board comprising a printed circuit board having vias thereon, and with vias along bottom edges of the side boards forming surface mount terminals. The method further includes the step of stacking a plurality of memory chips on top of one another to generate a stack of memory chips. The method further includes the steps of positioning the first and second side boards relative to the stack of memory chips such that terminals of the memory chips extend within the vias, and attaching the first and second side boards to the stack of memory chips by filling the vias with solder.

In accordance with another aspect of the invention, there is provided a method of interconnecting circuit board components to increase component density. The method includes the step of constructing a first printed circuit board that has a plurality of vias formed along a row. The method further includes the step of cutting the first printed circuit board along the row to expose the vias along an edge of the printed circuit board. The method further includes the steps of soldering the vias to respective pins of a semiconductor chip, and soldering the vias to pads of a second printed circuit board such that the first printed circuit board is substantially perpendicular to the second printed circuit board.

BRIEF DESCRIPTION OF THE DRAWINGS

These and other features of the invention will now be described with reference to the drawings of a preferred embodiment, which is intended to illustrate and not to limit the invention, and in which:

FIGS. 5a and 5b are top and bottom plan views of a portion of a circuit board panel, illustrating a process of manufacturing side boards in accordance with the present invention, and further illustrating conductive traces on first and second sides of the side boards of FIG. 1;

DETAILED DESCRIPTION OF PREFERRED EMBODIMENT

Figure 1:
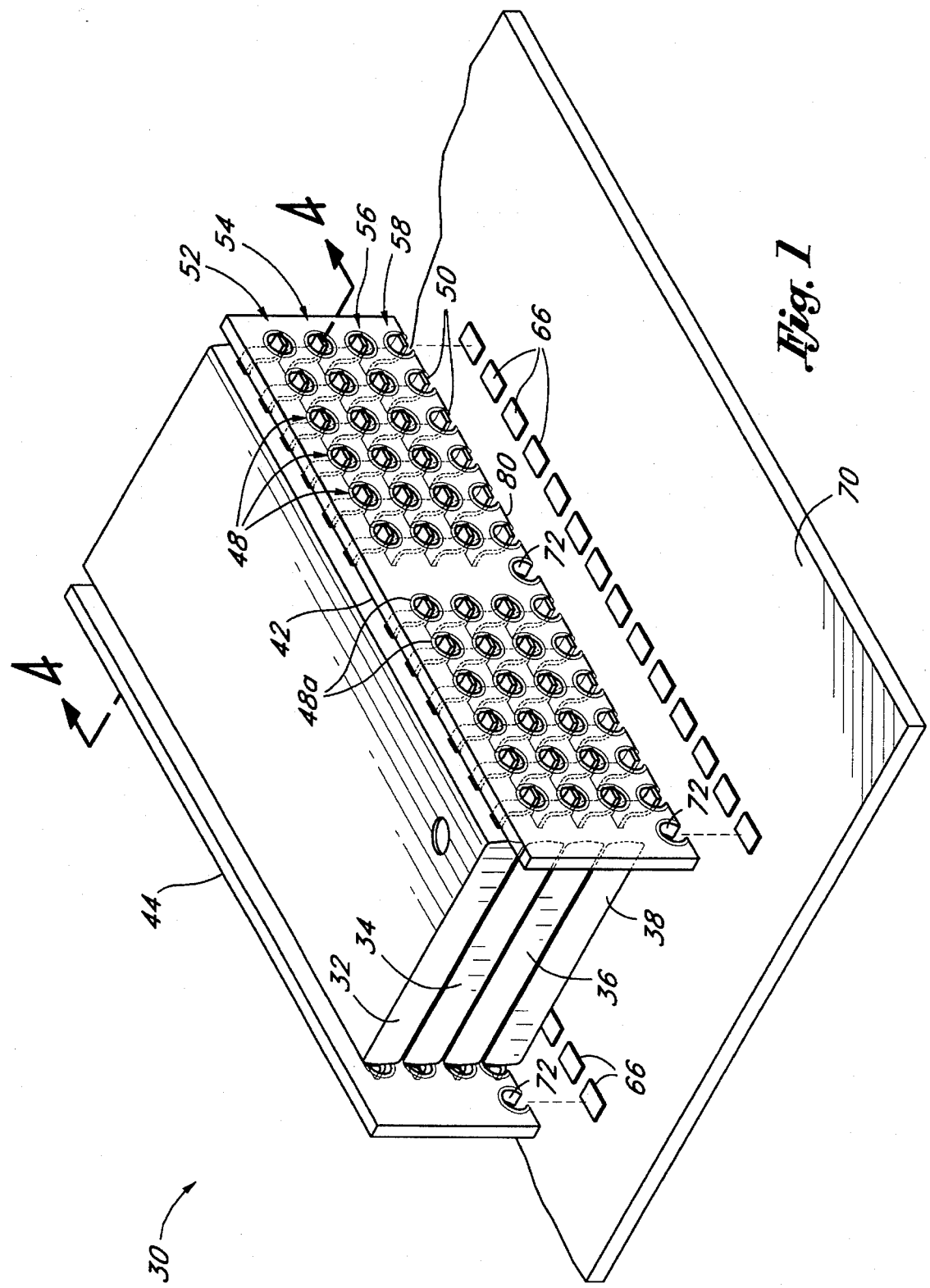
FIG. 1 is a perspective view illustrating a multi-chip memory module in accordance with a preferred embodiment of the present invention, illustrated above a portion of a printed circuit board to which the multi-chip memory module may be surface mounted. Solder plugs and circuit board traces are omitted to show the construction of the multi-chip memory module.

In accordance with one embodiment of the present invention, one multi-chip memory module design is described herein. In order to fully specify this preferred design, various embodiment-specific details are set forth, such as the number of memory chips in the module, the layouts of the printed circuit boards of the module, and the capacity, number of data bits and pin-outs of the memory chips. It should be understood, however, that these details are provided only to illustrate this single preferred embodiment, and are not intended to limit the scope of the present invention.

With reference to FIGS. 1–4, a 28-terminal multi-chip memory module 30 (hereinafter "multi-chip module") comprises four functionally-identical, vertically-stacked memory chips 32, 34, 36, 38. The memory chips 32–38 are conventional 24-pin surface mount TSOP ("thin small outline package") chips, available from Toshiba, Mitsubishi, and the like. Each memory chip 32–38 has a capacity of 16M×1-bit.

The vertically-stacked memory chips 32–38 are held together and electrically interconnected by a pair of printed circuit boards 42, 44, referred to herein as "side boards." The side boards 42, 44 are positioned in parallel to each other, and perpendicular to the top surfaces of the chips 32–38. The multi-chip module 30 is configured to be surface-mounted to a memory board 70 (FIG. 1) that has surface mount pads 66 thereon.

As used herein to describe the multi-chip module 30, the term "bottom" refers generally to the portion of the multi-chip module 30 that is closest to the memory board 70 when the multi-chip module 30 is mounted to the memory board 70. The terms "top," "bottom," and "lower" are not intended to imply a specific spacial orientation of the multi-chip module 30.

Figure 4:
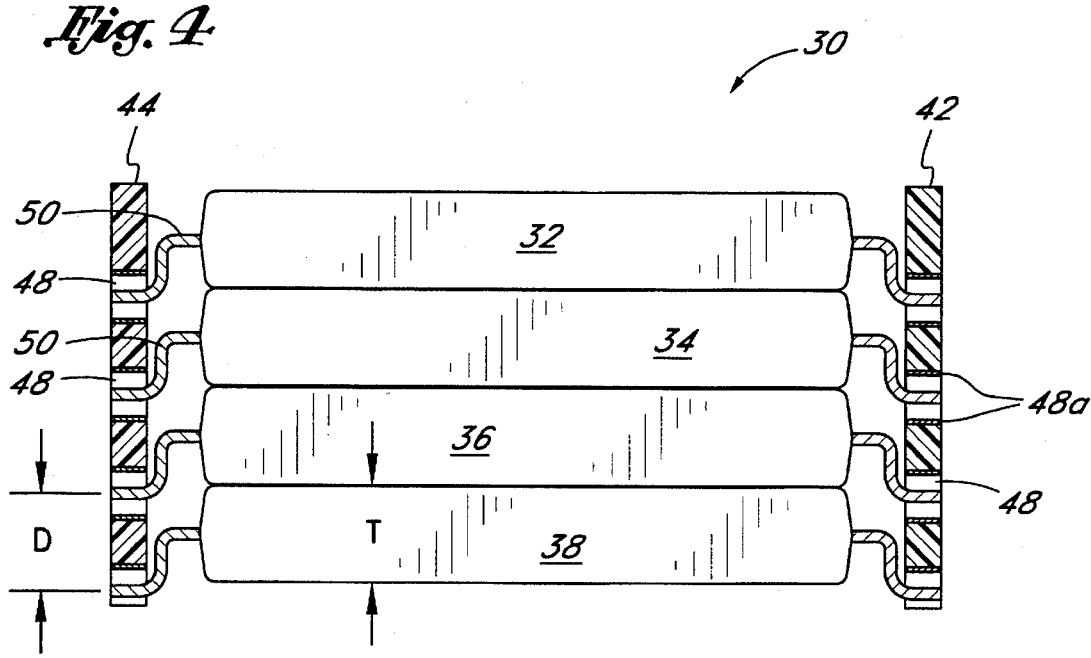
FIG. 4 is a cross sectional view taken along the line 4—4 of FIG. 1.

Each side board 42, 44 has a plurality of plated through-holes or "vias" 48 for receiving the pins 50 of the chips 32–38, with each via 48 comprising a conductive tubular cylinder portion 48a that extends through the side board. The vias 48 are positioned to form four horizontal rows 52, 54, 56, 58, with each row corresponding to a respective memory chip 32, 34, 36, 38. With reference to FIG. 4, the rows 52–58 of vias are formed such that the distance D between centers of adjacent rows is approximately equal to the thickness T of each chip 32–38, so that adjacent memory chips are touching (or nearly touching) each other when the multi-chip module 30 is assembled. This close spacing of adjacent memory chips contributes to a low profile of the multi-chip module 30 relative to the memory board 70 (FIG. 1), as further discussed below. Adjacent memory chips could alternatively be spaced apart from one another, as may be desirable in certain applications to facilitate the cooling of the memory chips 32–38.

Figure 2:
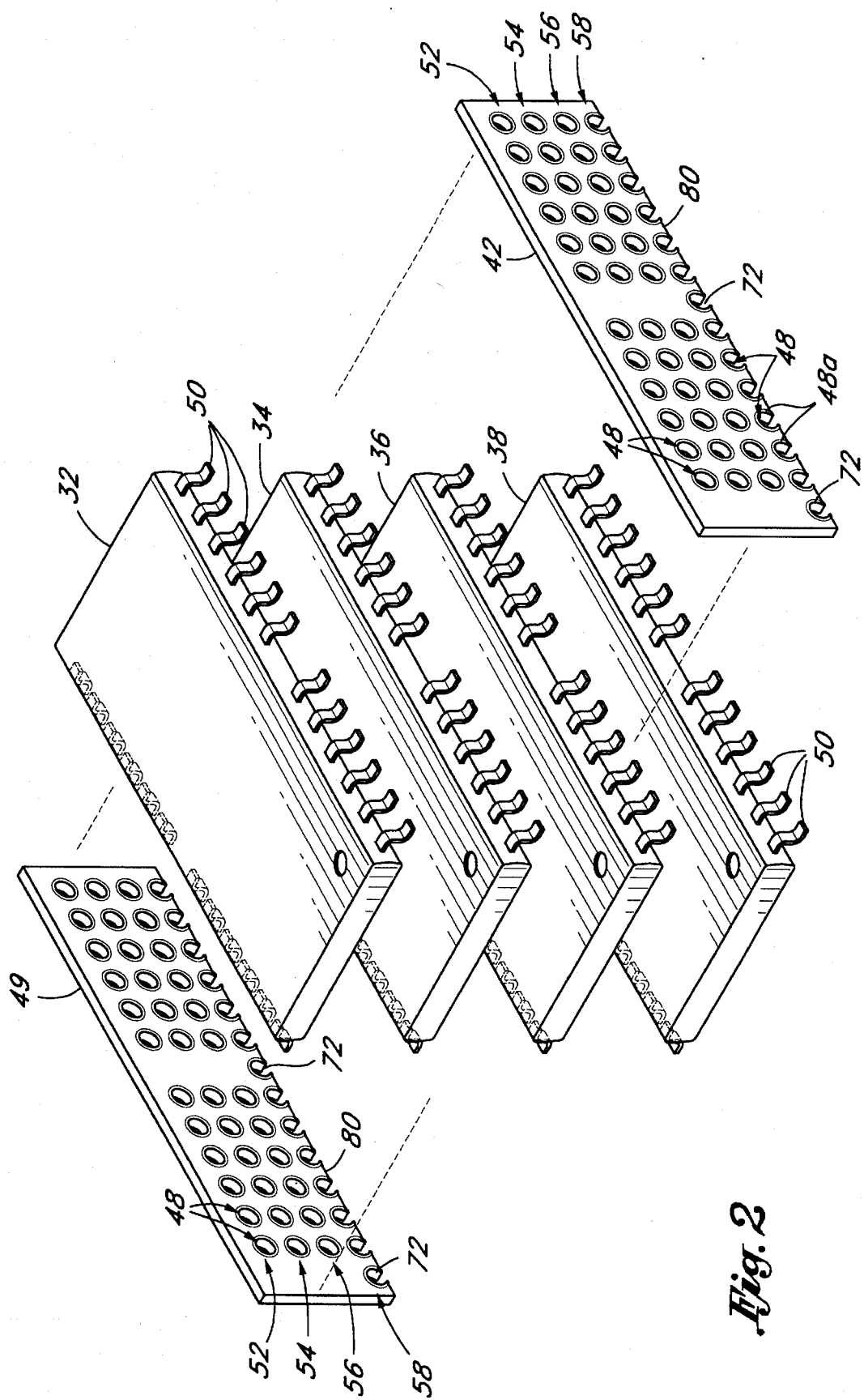
FIG. 2 is an exploded perspective view of the multi-chip memory module of FIG. 1.
Figure 3:
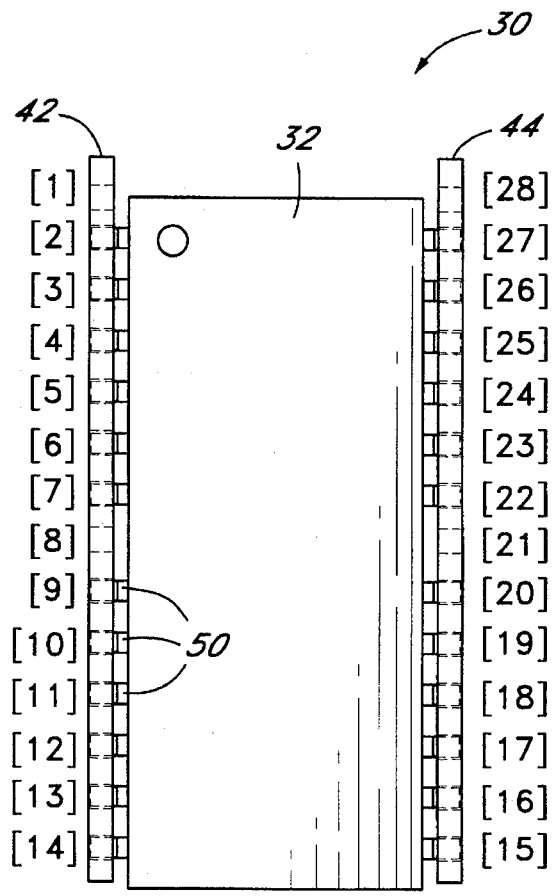
FIG. 3 is a top plan view of the multi-chip memory module of FIG. 1, with terminal numbers for the multi-chip memory module shown in brackets.

With reference to FIGS. 1 and 2, for each side board 42, 44, the vias of the bottom-most row 58 are partially cut away, with the conductive cylinder 48a of each such via extending to the lower edge 80 of the side board so that the pins 50 of the bottom-most chip 38 can be soldered directly to the surface mount pads 66 (FIG. 1) of the memory board 70. The vias 48 along the lower edges 80 of the side boards 42, 44 thus serve as surface mount terminals. This aspect of the multi-chip module 30, in combination with the close spacings between adjacent memory chips, allows the multi-chip module 30 to be mounted with a very low profile relative to the memory board 70. The lower edge 80 is preferably formed using a routing machine, as further described below. As illustrated in FIG. 3, the multi-chip module 30 has a total of 28 surface mount terminals (terminal numbers shown in brackets), with the terminals arranged in two rows of 14 terminals each.

With reference to FIG. 1, the surface mount pads 66 are arranged in two rows of 14 pads each (corresponding to the 14 terminals per side board 42, 44), with the distance between the two rows corresponding to the width of each chip 32–38. As best seen in FIGS. 1 and 3, the multi-chip module 30 occupies approximately the same area on the memory board 70 as would a single one of the memory chips 32–38.

Conductive traces (shown in FIGS. 5a and 5b) of the side boards 42, 44 interconnect the pins 50 of the memory chips 32–38 such that all memory locations of all memory chips 32–38 can be utilized. In the embodiment shown, the memory chips 32–38 are interconnected such that all four 16M×1-bit chips 32–38 are selected simultaneously, with each chip supplying (or, during a write cycle, storing) one bit of data. The multi-chip module 30 thus acts as a 16M×4-bit memory module.

With reference to FIGS. 1–3, four "extra" vias 72 are provided along the lower edges 80 of the multi-chip module 30. The four vias 72 serve as terminals only, and do not receive pins 50 of any of the memory chips 32–38. Each via 72 provides access to either a data input pin or a data output pin of a respective memory chip 32–38, and is thus dedicated to a single chip. It will be recognized that other types of terminal structures could be used in place of the vias 72.

To assemble the multi-chip module 30, the memory chips 32–38 are initially stacked on top of one another. The side boards 42, 44 are then positioned so that the pins 50 extend within the corresponding vias, as best shown by FIG. 4. Advantageously, no modification to the pins 50 of the standard TSOP memory chips 32–38 is required. Once the side boards 42, 44 are properly positioned, all of the vias 48 of both side boards 42, 44 are filled with solder (solder plugs omitted in FIGS. 1–4). A solder with a relatively high melting point is used for this purpose so that the multi-chip module 30 can subsequently be mounted to the memory board 70 using a solder with a lower melting point without melting the solder within the vias 48.

A preferred process for manufacturing the side boards 42, 44 of the multi-chip module 30 will now be described with reference to FIGS. 5a and 5b, which illustrate a circuit board panel 90 mid-way through the manufacturing process. FIG. 5a illustrates the outward-facing surface (relative to the multi-chip module 30) of the side board 42, and the inward-facing surface of the side board 44. FIG. 5b illustrates the inward-facing surface of the side board 42, and the outward-facing surface of the side board 44.

Traces 92 are initially formed on both sides of the circuit board panel 90 using a conventional film etching process. Via holes are then drilled through the circuit board panel 90, with the holes positioned to correspond to the pin positions of the chips 32–38. A conventional plating process is then used to form the conductive cylinders 48a of the vias 48 (preferably formed from copper), and to interconnect the via cylinders 48a to the appropriate traces 92.

Once the vias 48 and traces 92 are formed, the panel 90 is routed to form the lower edge 80 and the top edge 81 of each side board 42, 44. The panel 90 shown in FIGS. 5a and 5b is mid-way through the routing process, with top and bottom edges 80, 81 formed only for the four side boards 42, 44 closest to the bottom of each Figure. During the routing process, the routing bit is preferably passed so that approximately 5% of the diameter of each via cylinder 48a along the bottom row 58 is cut away. Due to imperfections in the routing process, the lower portions of some cylinders may be pushed inward (toward the centers of the respective vias) by the routing bit, as schematically shown at 96 in FIGS. 5a and 5b (and further illustrated in FIG. 6b). Cylinders that are formed in this manner have been found to work well as surface mount terminals, and need not be modified.

The panel 90 is scored on both sides to form break-away grooves 94. The break-away grooves 94 can be formed either before or after the above-described routing process. Finally, side boards 42, 44 are manually broken away from the panel 90, and soldered to stacks of memory chips (as described above) to form multi-chip modules 30.

Figure 6A:
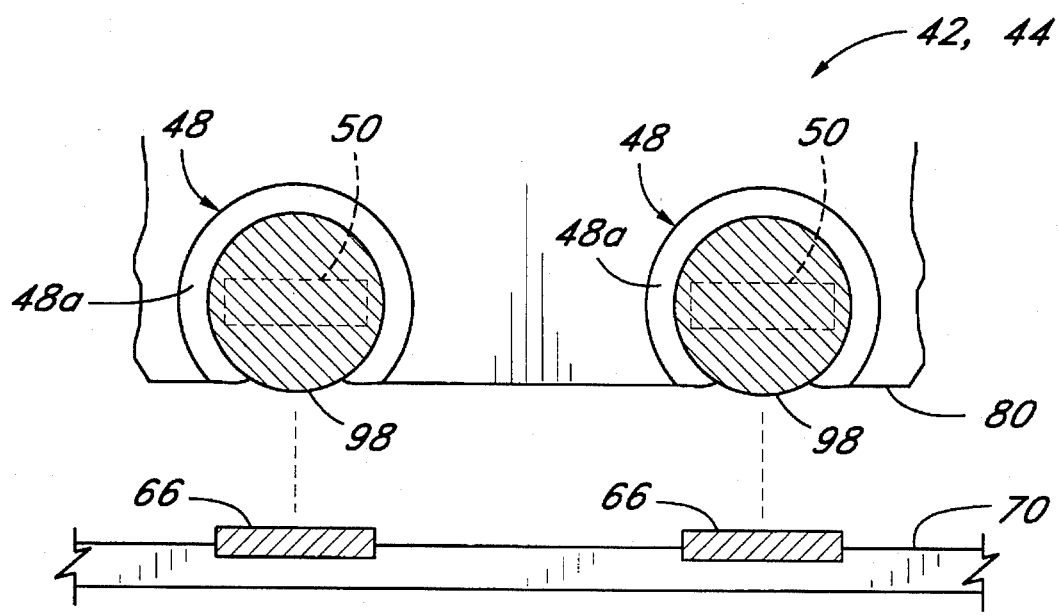
FIG. 6a is an enlarged view in partial cross section, showing a bottom portion of a side board of the multi-chip memory module of FIG. 1 with partially cut-away vias filled with solder to form surface mount terminals, and further showing the printed circuit board and pads of FIG. 1.
Figure 6B:
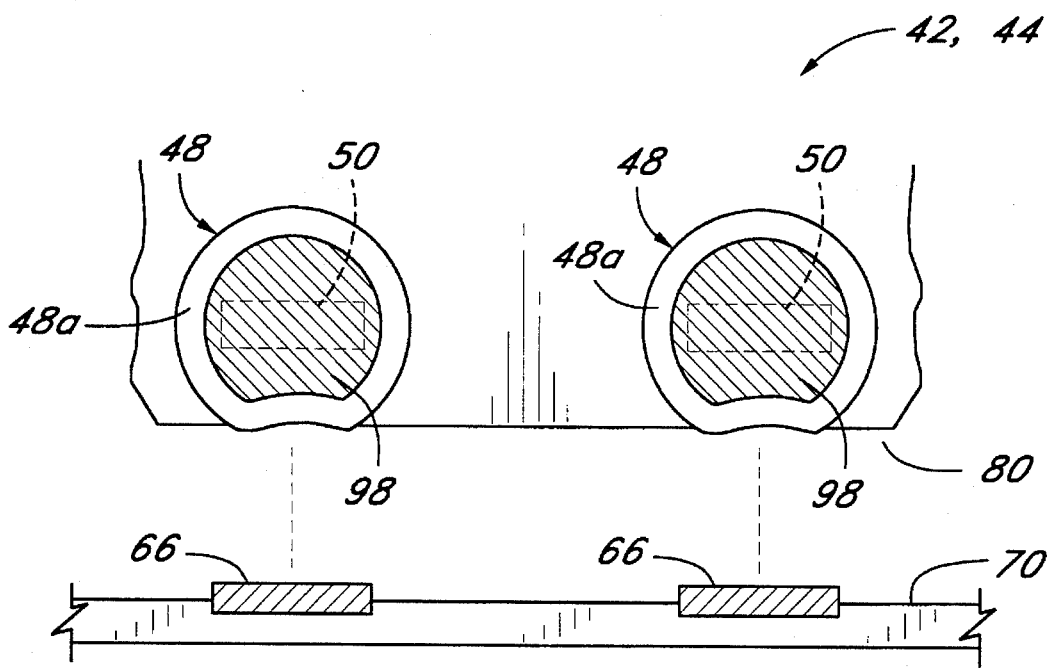
FIG. 6b is an enlarged view in partial cross section of a side board and a printed circuit board with pads, illustrating an alternative configuration that results when conductive cylinders of vias are pushed inward during a routing process.

With reference to FIG. 6a, once the partially cut-away vias 48 along the bottom edge 80 of a side board 42, 44 are filled with solder, a portion of each solder plug 98 is exposed along the bottom edge 80, forming a terminal that can be soldered to a corresponding surface mount pad 66. Each solder plug 98 preferably extends slightly below the lower edge 80, facilitating connection of the multi-chip module 30 to the pads 66. As illustrated in FIG. 6b, via cylinders 48a that are pushed inward during the routing process are similarly exposed along the lower edge 80, and are well-suited for connection to the pads 66.

Figure 7:
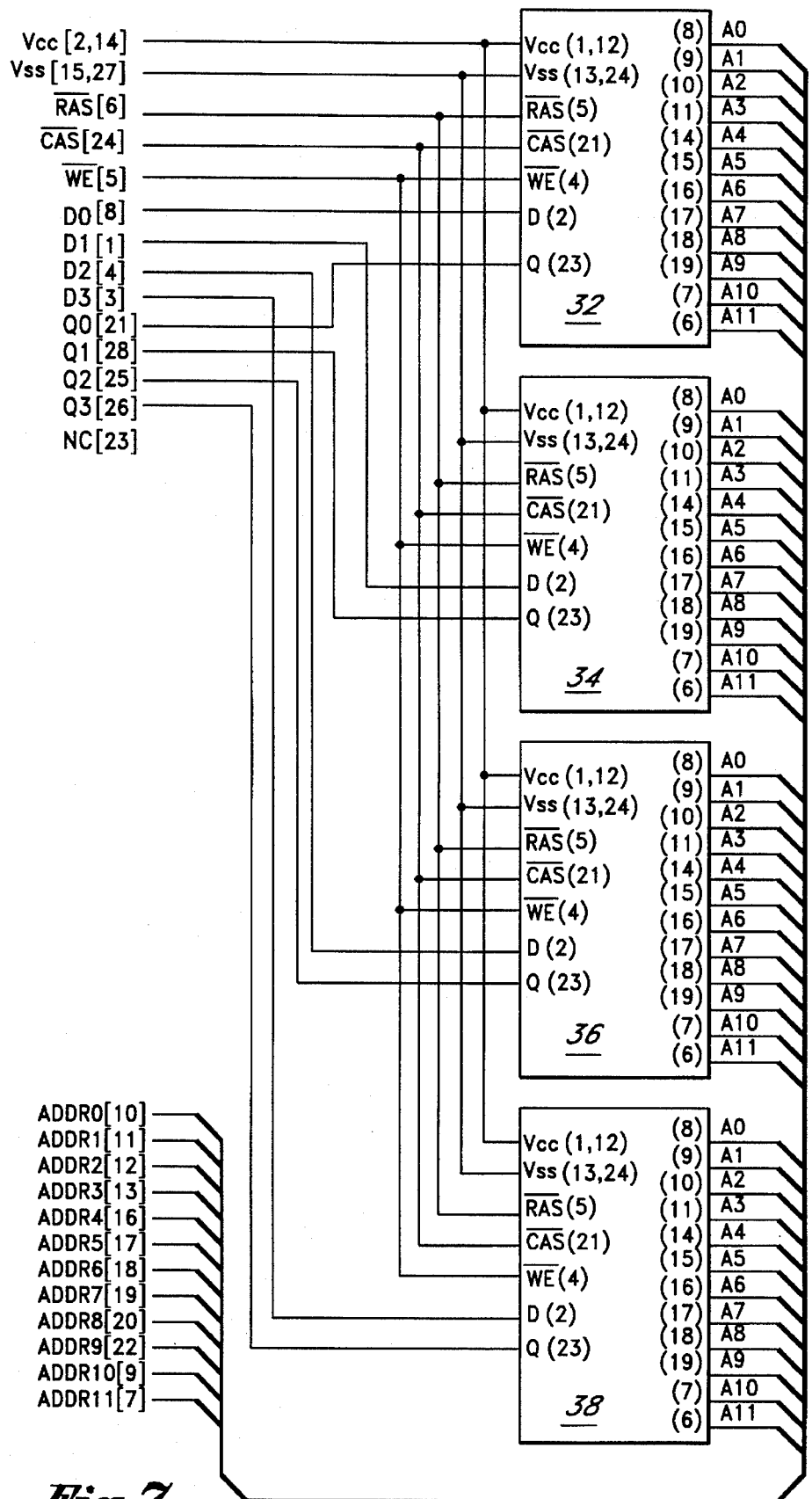
FIG. 7 is a schematic diagram illustrating the electrical interconnections of memory chip pins and side board terminals for the multi-chip memory module of FIG. 1, with chip pin numbers shown in parenthesis and multi-chip memory module terminal numbers shown in brackets.

FIG. 7 illustrates the interconnections the memory chips 32–38 of the multi-chip module 30, and also illustrates the connections between the memory chips 32–38 and the 28 terminals of the multi-chip module 30. Signal names for each of the 28 multi-multi-chip module terminals are shown at the left of FIG. 7. Terminal numbers for the multi-chip module 30 are shown in brackets in FIG. 7, and correspond to the bracketed terminal numbers of FIG. 3. Pin numbers for the chips 32–38 are shown in parenthesis in FIG. 6. As shown, like address pins (A0–A11), control pins (RAS, CAS and WE), and power pins (VCC and VSS) of the four memory chips 32–38 are connected together, and are connected to respective terminals of the multi-chip module 30. For example, the A0 pins (pin 8) of all four memory chips 32–38 are connected together, and are accessed via terminal 10 of the multi-chip module. With like address and control pins connected together, all four chips 32–38 are selected simultaneously, and are fed identical address values. The data-input pin (D) of each memory chip 32–38 is connected to a respective dedicated input terminal (D0–D3) of the multi-chip module 30, allowing a 4-bit value to be written to the multi-chip module 30 on each write cycle. Similarly, the data-output pin (Q) of each memory chip 32–38 is connected to a respective dedicated output terminal (Q0–Q3), allowing a 4-bit value to be read from to the multi-chip module 30 on each read cycle. As will be recognized, the chips 32–38 could alternatively be connected such that fewer than all of the chips are selected with each multi-chip module access. For example, a 64M×4-bit multi-chip module can be constructed from four 16M×4-bit memory chips that are interconnected so that only one memory chip is selected at a time. In such an arrangement, the write enable pins and like address, data-in, and data-out pins of all four memory chips would be connected, and the RAS and CAS pins of each chip would be connected to dedicated RAS and CAS input lines (i.e., one pair of RAS/CAS input lines per memory chip).

Figure 8:
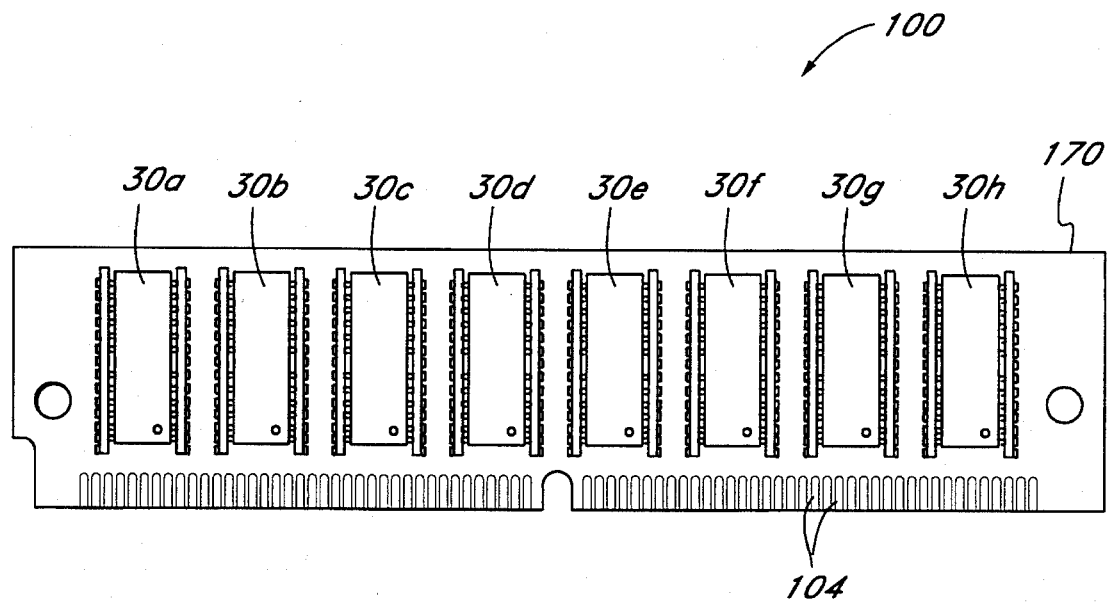
FIG. 8 is a plan view of a single in-line memory module having eight multi-chip memory modules surface mounted to one side thereof.

FIG. 8 illustrates one side of a 16M×36 bit single in-line memory module (SIMM) 100 in accordance with the present invention. The SIMM 100 comprises a SIMM board 170 having eight 16M×4 bit multi-chip modules 30a–30h mounted on the side shown. Four 16M×1-bit TSOP memory chips (not shown) are mounted on the opposite side of the SIMM board 170, in addition to one or more conventional buffer chips. Standard connector terminals 104 are provided along the bottom edge of the SIMM 100, permitting insertion of the SIMM into a connector slot. The eight 16M×4-bit multi-chip modules 30a–30h and four 16M×1-bit memory chips combine to produce a data width of 36 bits (32 data bits plus 4 error-correction code bits). The low profile of each multi-chip module 30a–30h advantageously enables multiple SIMMs to be mounted in close proximity to one another within a computer.

While the design of a single multi-chip module 30 has been described in detail herein, various modifications to the design are possible without departing from the scope of the present invention. For example, a different type of memory chip can be used in the place of the 16M×1-bit chips 32–38 of the multi-chip module 30. Alternatively, a mixture of memory chips of different types can be used. Further, a different number of chips per multi-chip module can be used. Further, the side boards 42, 44 may be constructed according to alternative techniques that are apparent to those skilled in the art.

It will further be noted that the stacking techniques described herein may be useful in alternative applications that do not involve the stacking of memory chips. For example, the stacking techniques could be used to stack multiple buffer chips, or to stack multiple logic driver chips.

Accordingly, the scope of the present invention is intended to be defined only by reference to the appended claims.

What is claimed is:

1. A multi-chip memory module, comprising:

a plurality of memory chips stacked on top of one another, each memory chip of said plurality having conductive surface mount pins; and first and second side boards mounted to said memory chips such that said side boards are substantially parallel to one another, each side board having:

vias for receiving said surface mount pins of said memory chips, said vias arranged in rows such that each row corresponds to a respective memory chip of said plurality, vias of a bottom-most row receiving surface mount pins of a bottom-most memory chip of said plurality, said bottom-most row falling along a lower side board edge such that vias of said bottom-most row serve as surface mount terminals for surface mounting the multi-chip memory module to pads of a printed circuit board; and conductive traces for interconnecting said vias.

2. A multi-chip memory module as defined in claim 1, wherein said vias of said bottom-most row are exposed along said lower side board edge.

3. A multi-chip memory module as defined in claim 1, wherein all memory chips of said plurality are functionally identical.

4. A multi-chip memory module as defined in claim 1, wherein the total number of surface mount terminals on said first and second side boards is greater than the number of said surface mount pins on any one of said plurality memory chips.

5. A multi-chip memory module as defined in claim 1, wherein said memory chips of said plurality are interconnected by said traces such that all memory chips of said plurality are selected simultaneously.

6. A multi-chip memory module as defined in claim 1, in combination with a memory board having surface mount pads thereon, said vias of said bottom-most row soldered to said surface mount pads.

7. A module that includes at least one multi-chip module, said module comprising:

a circuit board having at least first and second sets of surface mount pads;

a first planar side board including a plurality of surface mount contacts positioned along an edge of said first side board which abuts said circuit board, said plurality of surface mount contacts of said first side board being surface-mounted to said first set of surface mount pads of said circuit board such that said first side board is substantially perpendicular to said circuit board;

a second planar side board including a plurality of surface mount contacts positioned along an edge of said second side board which abuts said circuit board, said plurality of surface mount contacts of said second side board being surface-mounted to said second set of surface mount pads of said circuit board such that said second side board is substantially perpendicular to said circuit board and substantially parallel to said first side board; and a plurality of standard surface mount chips stacked between said side boards, each chip including a plurality of pins, a portion of each pin extending beyond a chip surface which lies generally parallel to said circuit board with said chip positioned between said side boards, each chip of said plurality conductively connected to said first side board and said second side board.

8. A module as defined in claim 7, wherein said first and second sets of surface mount pads are arranged in respective first and second rows.

9. A module as defined in claim 7, wherein a surface area of a region between said first and second side boards on said circuit board is generally equal to a surface area occupied by one of said chips of said plurality.

10. A module as defined in claim 7, wherein said standard surface mount chips of said plurality are stacked on top of one another.

11. A module as defined in claim 7, wherein all chips of said plurality are functionally identical.

12. A module as defined in claim 7, wherein a lower-most chip of said plurality is soldered to said first and second sets of surface mount pads.

13. A module as defined in claim 7, wherein each chip of said plurality is a memory chip.

14. A module as defined in claim 12, wherein said lower-most chip is additionally soldered to vias of said first and second side boards.

15. A module as defined in claim 14, wherein said lower-most chip is soldered to said vias with a first solder that has a first melting point, and is soldered to said first and second sets of surface mount pads with a second solder that has a second melting point, said second melting point lower than said first melting point.

\* \* \* \* \*